United States Patent
Abe

(10) Patent No.: US 7,145,156 B2
(45) Date of Patent: Dec. 5, 2006

(54) IMAGE PROCESSING METHOD, IMAGE PROCESSING APPARATUS AND SEMICONDUCTOR MANUFACTURING METHOD

(75) Inventor: Hideaki Abe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 126 days.

(21) Appl. No.: 11/054,949

(22) Filed: Feb. 11, 2005

(65) Prior Publication Data

US 2005/0184235 A1    Aug. 25, 2005

(30) Foreign Application Priority Data

Feb. 12, 2004   (JP) .............................. 2004-035137

(51) Int. Cl.
*H01J 37/28* (2006.01)
*H01J 37/153* (2006.01)

(52) U.S. Cl. .............................. 250/492.2; 250/492.3; 250/306; 250/307; 250/310; 382/145; 356/237.1

(58) Field of Classification Search ...................... None
See application file for complete search history.

(56) References Cited

U.S. PATENT DOCUMENTS 5,331,161 A * 7/1994 Ohdomari et al. .......... 250/309

FOREIGN PATENT DOCUMENTS

JP        11-296680       10/1999
JP        2002-359271     12/2002

* cited by examiner

*Primary Examiner*—Nikita Wells
(74) *Attorney, Agent, or Firm*—Finnegan, Henderson, Farabow, Garrett & Dunner, L.L.P.

(57) ABSTRACT

An image processing method, which processes an image of a surface shape of a sample based on a detection quantity of secondary electrons obtained by irradiating a charged particle to the sample, comprises: extracting a reference profile, which indicates the detection quantity of the secondary electrons in a gray value, from an image of a reference area in the surface shape of the sample, the image of the reference area being used as a reference of an image processing; extracting an intended profile, which indicates the detection quantity of the secondary electrons in a gray value, from an image of an intended area in the surface shape of the sample, the image of the intended area being used as a target of image processing; and replacing the intended profile with the reference profile to correct the image in the intended area.

18 Claims, 11 Drawing Sheets

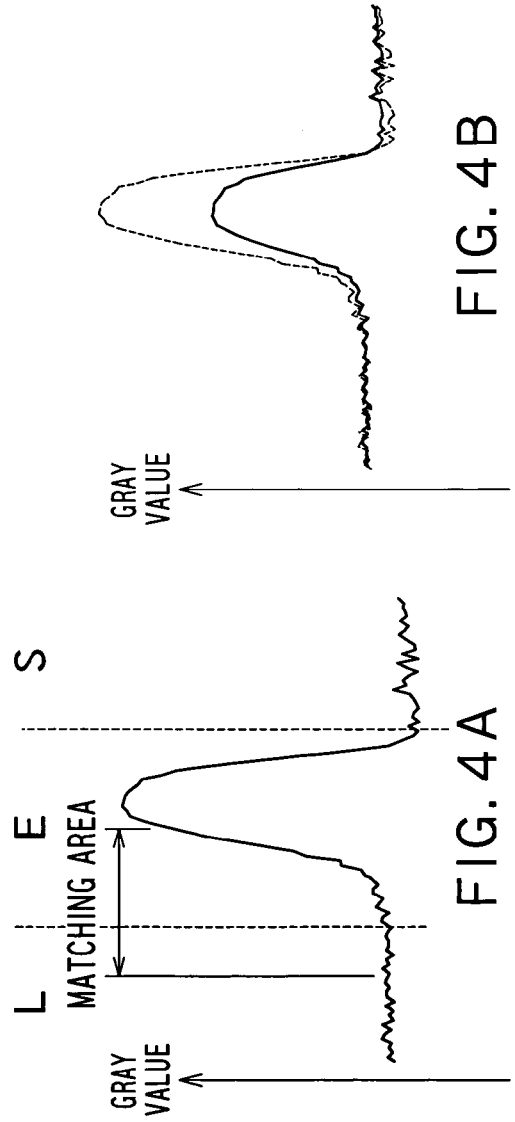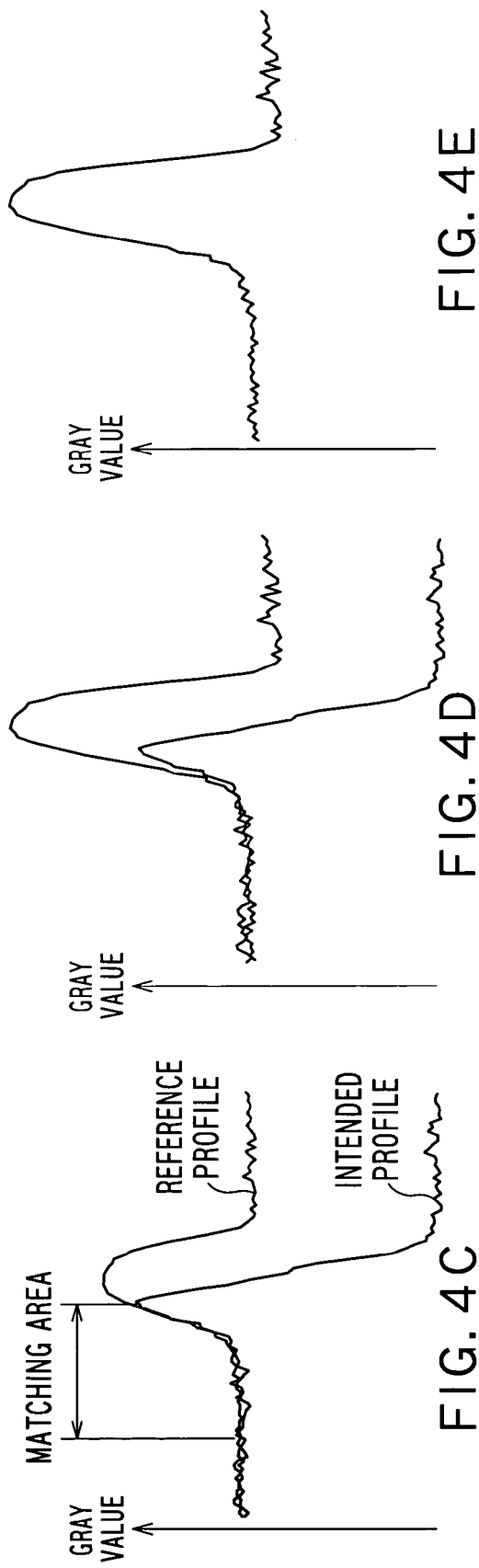

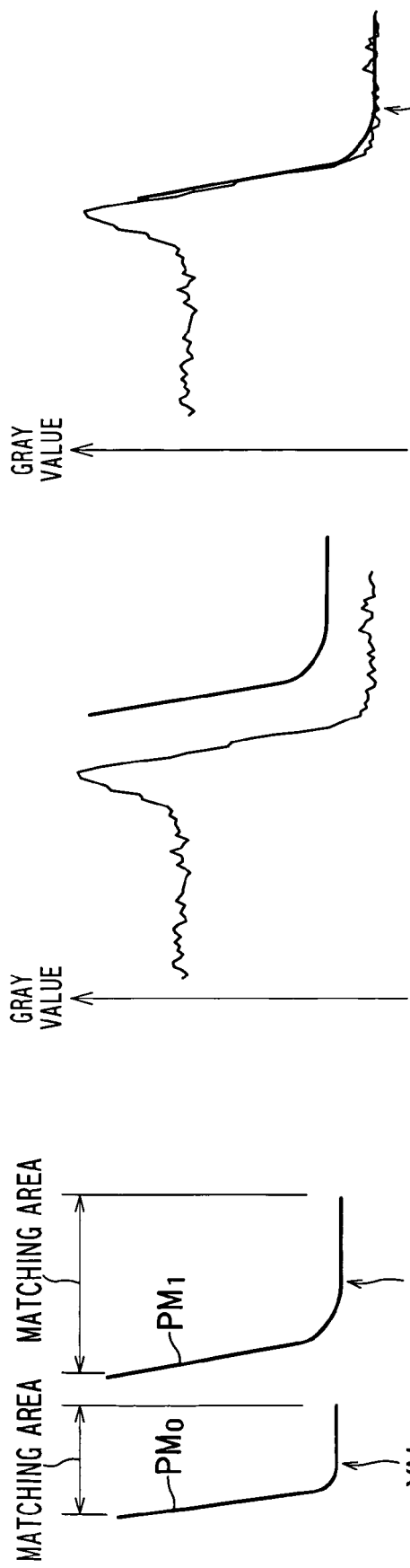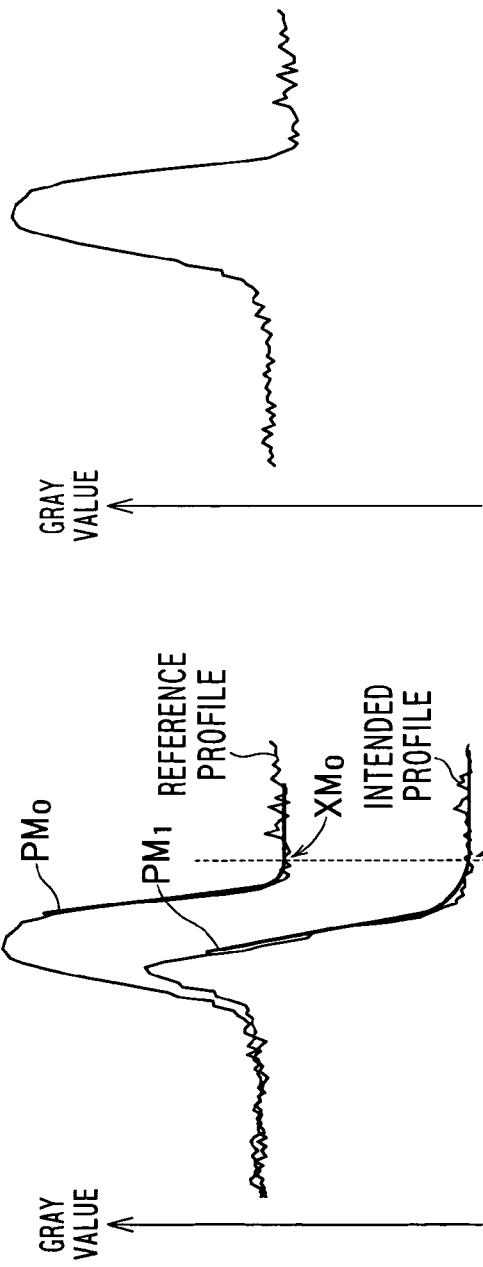

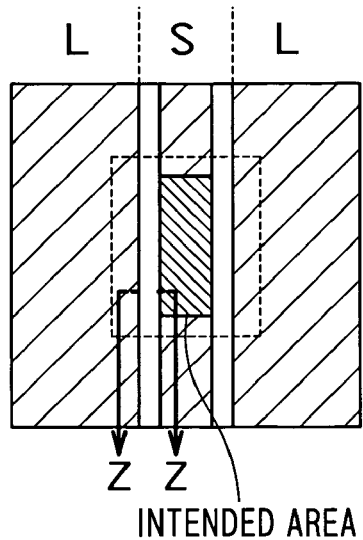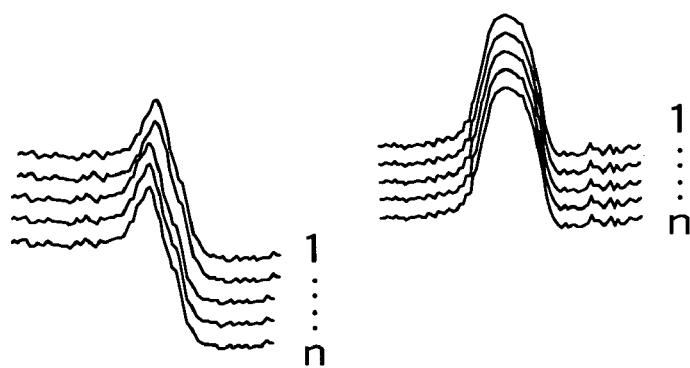
FIG. 8A  FIG. 8B  FIG. 8C
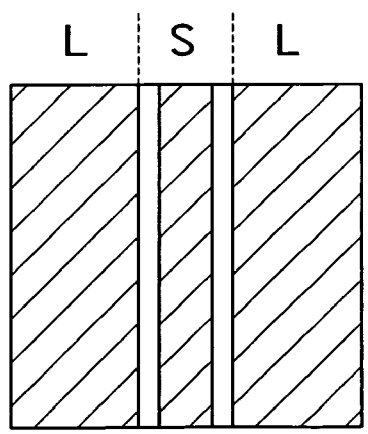
FIG. 8D

IMAGE PROCESSING METHOD, IMAGE PROCESSING APPARATUS AND SEMICONDUCTOR MANUFACTURING METHOD

CROSS-REFERENCE TO RELATED APPLICATIONS

This application is based upon and claims the benefit of priority from the prior Japanese Patent Applications No. 2004-35137, filed on Feb. 12th, 2004, the entire contents of which are incorporated herein by reference.

BACKGROUND OF THE INVENTION

1. Field of the Invention

The present invention relates to an image processing method, an image processing apparatus and a semiconductor manufacturing method.

2. Background Art

In recent years, along miniaturization of semiconductor devices, surface patterns of semiconductors are also becoming finer. Therefore, in CD (critical dimension) measurement of a surface pattern, a tolerance of measurement error becomes stricter.

In order to improve precision of CD measurement, a scanning electron microscopy such as a CD-SEM (critical dimension-scanning electron microscopy or microscope) or the like is generally used. The CD-SEM irradiates an electron beam onto a sample, and detects secondary electrons from the sample. Detection quantity of secondary electrons mainly depends on a surface pattern. Therefore, a surface shape of the sample can be imaged based on the detection quantity of the secondary electrons. An image obtained based on the detection quantity of the secondary electrons is hereinafter referred to as a "secondary electron image". The CD-SEM extracts an outline of the surface pattern from the secondary electron image, and measures dimensions of a desired part of the surface pattern.

The contrast of the secondary electron image varies depending on a surface pattern and a material of the sample. Therefore, in order to carry out a stable measurement with the CD-SEM, the contrast of the secondary electron image needs to be improved. In order to improve the contrast, a total grayscale level is calculated from a gray value of an area of interest within an image, and the contrast of the secondary electron image is converted based on the grayscale level (see Japanese Patent Application No. H11-296680 Publication).

The secondary electron image depends on not only the surface pattern of the sample but also a material of the sample, a potential of the sample, and an electric field near the sample. A contrast that depends on the surface shape of the sample is called a shape contrast. A contrast that depends on the material of the sample is called a material contrast. A contrast that depends on the potential of the sample and the electric field near the sample is called a potential contrast. In this way, the secondary electron image includes various contrasts.

A contrast that is necessary for a CD measurement is a shape contrast attributable to a surface shape. Other contrasts cause a measurement error. This measurement error is called a "SEM bias". The SEM bias is a difference between a measurement value calculated based on a surface image obtained from above the sample with the CD-SEM or the like and an accurate measurement value calculated based on a cross-sectional image on the cut surface of the sample.

When a measurement value is calculated based on a surface image of only a shape contrast, the SEM bias becomes constant. However, in general, when a space width becomes small and when the influence of the potential contrast becomes noticeable, the SEM bias at the time of measuring the space width becomes small. This is called a "SEM bias variation".

For example, a contrast of a surface image changes depending on a space width as shown in FIG. 11. When a space width is large, gray values of a line L and space S become substantially equal, and therefore, there is little difference in the contrast of the surface image between the line L and the space S, as shown by a profile along a line A—A. On the other hand, when a space width becomes small, a gray value at the space S side becomes smaller than that at the line L side, as shown by profiles along a line B—B and a line C—C, respectively. Therefore, in this case, the surface image becomes dark at the part of the space S. This is because a distance between adjacent lines becomes small, and the electric field due to an electric charge accumulated on the lines affects the secondary electrons from the bottom surface of the space S, and this decreases the quantity of the secondary electrons detected by a detector. Because the contrast changes depending on the space width, the SEM bias varies.

If the SEM bias is constant, it is sufficient to calculate the SEM bias from a surface image and a cross-sectional image at one position of the sample. However, because the SEM bias changes as described above, the SEM bias needs to be calculated from surface images and cross-sectional images at many positions having various patterns. This calculation involves enormous amount of work and has poor work efficiency. In a complex device configuration, various contrasts are conjugated. Therefore, it is difficult to calculate the SEM bias. These problems cannot be solved by gamma correction or by a conventional technique described in Japanese Patent Application No. H11-296680 Publication.

It is, therefore, desired to obtain an image processing method and an image processing apparatus capable of correcting a variation in the SEM bias more easily than conventional practices, and capable of measuring a surface pattern of a sample accurately and efficiently.

SUMMARY OF THE INVENTION

An image processing method according to an embodiment of the present invention, which method processes an image of a surface shape of a sample based on a detection quantity of secondary electrons obtained by irradiating a charged particle to the sample, comprises: extracting a reference profile, which indicates the detection quantity of the secondary electrons in a gray value, from an image of a reference area in the surface shape of the sample, the image of the reference area being used as a reference of an image processing; extracting an intended profile, which indicates the detection quantity of the secondary electrons in a gray value, from an image of an intended area in the surface shape of the sample, the image of the intended area being used as a target of image processing; and replacing the intended profile with the reference profile to correct the image in the intended area.

An image processing apparatus according to an embodiment of the present invention, which generates an image of a surface shape of a sample based on a detection quantity of secondary electrons obtained by irradiating a charged particle to the sample and which processes the image, comprises:

a charged particle gun irradiating a charged particle to the sample; a detector detecting secondary electrons generated from the sample by irradiating the charged particle; a monitor displaying the image of the surface shape of the sample based on a detection quantity of secondary electrons detected by the detector; a processor extracting a reference profile, which indicates the detection quantity of the secondary electrons in a gray value, from an image of a reference area in the surface shape of the sample, the image of the reference area being used as a reference of an image processing, the processor extracting an intended profile, which indicates the detection quantity of the secondary electrons in a gray value, from an image of an intended area in the surface shape of the sample, the image of the intended area being used as a target of image processing, and the processor replacing the intended profile with the reference profile to correct the image in the intended area.

A semiconductor manufacturing method according to an embodiment of the present invention, the method using an image processing apparatus which generates an image of a surface shape of a sample based on a detection quantity of secondary electrons obtained by irradiating a charged particle to the sample and which processes the image, the image processing apparatus comprising a charged particle gun irradiating a charged particle to the sample; a detector detecting secondary electrons generated from the sample by irradiating the charged particle; a monitor displaying the image of the surface shape of the sample based on a detection quantity of secondary electrons detected by the detector; a processor extracting a reference profile, which indicates the detection quantity of the secondary electrons in a gray value, from an image of a reference area in the surface shape of the sample, the image of the reference area being used as a reference of an image processing, the processor extracting an intended profile, which indicates the detection quantity of the secondary electrons in a gray value, from an image of an intended area in the surface shape of the sample, the image of the intended area being used as a target of image processing, and the processor replacing the intended profile with the reference profile to correct the image in the intended area, the semiconductor manufacturing method comprising: measuring a dimensions of surface patterns on the sample using the profile after the replacement.

BRIEF DESCRIPTION OF THE DRAWINGS

FIGS. 4(A) to 4(E) are diagrams showing a state that an intended profile is replaced with a reference profile according to a second embodiment of the present invention;

FIGS. 6(A) to 6(E) are diagrams showing a state that an intended profile is replaced with a reference profile according to a third embodiment of the present invention;

FIGS. 8(A) to 8(D) are diagrams showing a state that an intended profile is replaced with a reference profile according to a fourth embodiment of the present invention;

DETAILED DESCRIPTION OF THE INVENTION

Hereafter, embodiments of the present invention will be described more specifically with reference to the drawings. Note that the invention is not limited by the embodiments.

Figure 1:
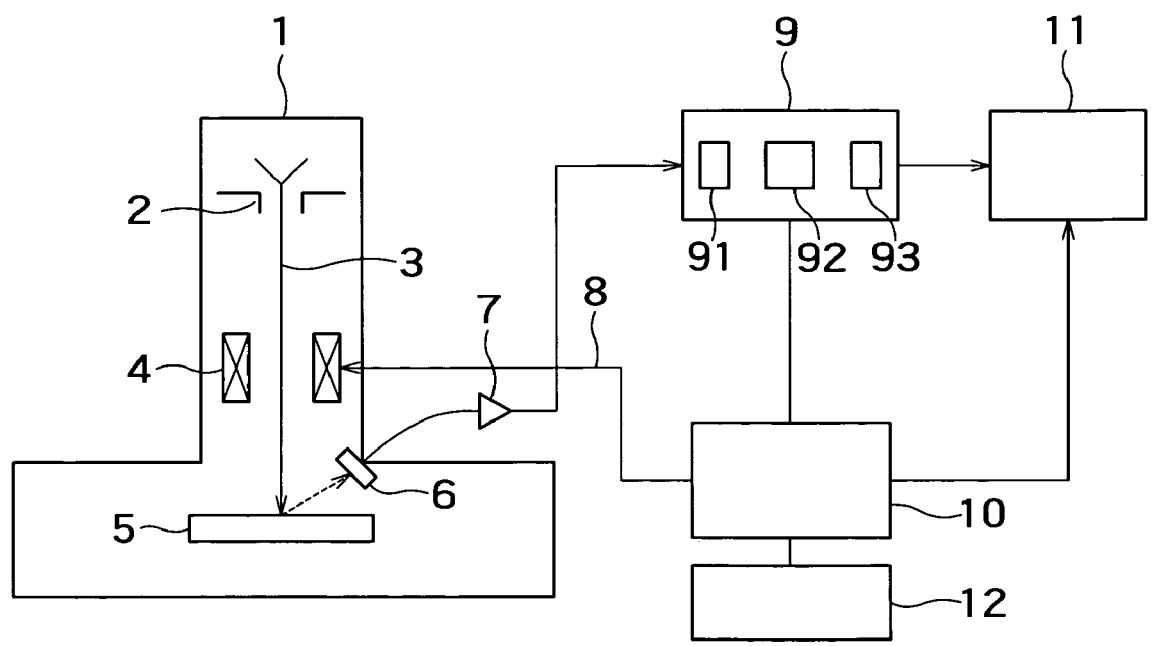
FIG. 1 is a block diagram of a CD-SEM 100 according to an embodiment of the present invention.

FIG. 1 is a block diagram of a scanning electron microscopy (hereinafter, also referred to as CD-SEM) 100 according to an embodiment of the present invention. The CD-SEM 100 includes a column 1, a charged particle gun 2, an electron detector 6, an amplifier 7, a deflector 4, an image processor 9, a control calculator 10, a display 11, and an input part 12.

The charged particle gun 2 disposed in the column 1 emits a charged particle beam 3. The charged particle beam 3 is converged in an objective lens not shown, and is irradiated to a sample 5. The charged particle beam 3 is electron or ion. The deflector 4 can move a position of the charged particle beam 3 using a control signal 8 from the control calculator 10. With this arrangement, the deflector 4 executes a raster scan with the charged particle beam 3 on the surface of the sample 5.

Based on the irradiation of the charged particle 3, secondary electrons generate from the surface of the sample 5. The electron detector 6 detects these secondary electrons. The amplifier 7 amplifies a signal that indicates quantity of the secondary electrons detected by the electron detector 6. The image processor 9 executes A/D conversion on the signal output from the amplifier 7, and generates digital image data of a surface shape of the sample 5. The monitor 11 displays the image data. The image display processor 9 includes a memory 91 that stores the digital image data, an image processing circuit 92 that processes the image, and a display control circuit 93 that controls the monitor 11. An input unit 12 such as a keyboard and a mouse is connected to the control calculator 10.

The control calculator 10 can be provided inside the CD-SEM 100, or can be a computer disposed at the outside of the CD-SEM 100. The image display processor 9 and the monitor 11 can be disposed separately from the control calculator 10, or can be built into the control calculator 10. Alternatively, a processor and a monitor incorporated in the control calculator 10 can be used for the image display processor 9 and the monitor 11.

Figure 2C:
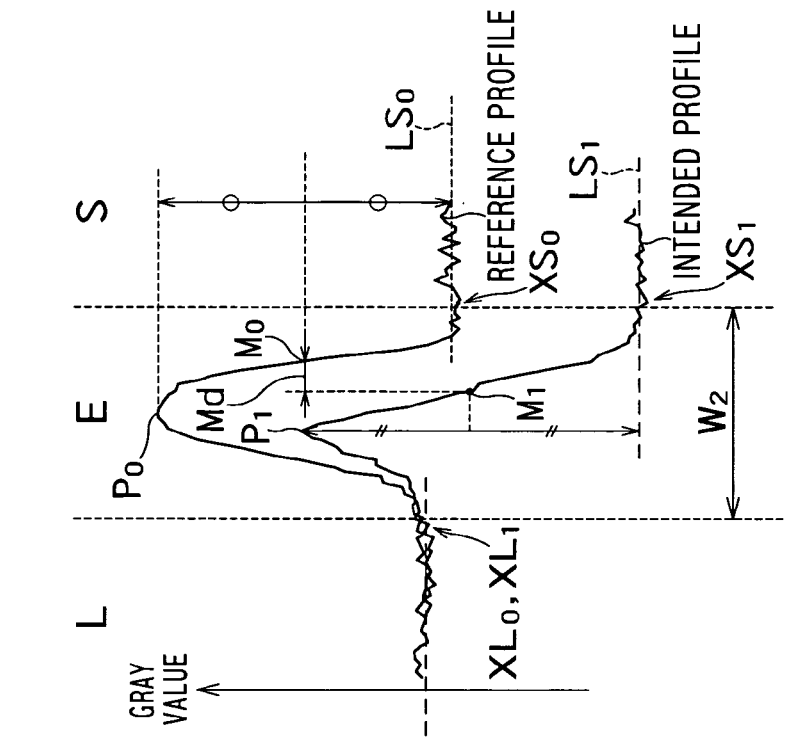
FIGS. 2(A) to 2(C) are diagrams showing a state that an intended profile is replaced with a reference profile.
Figure 2B:
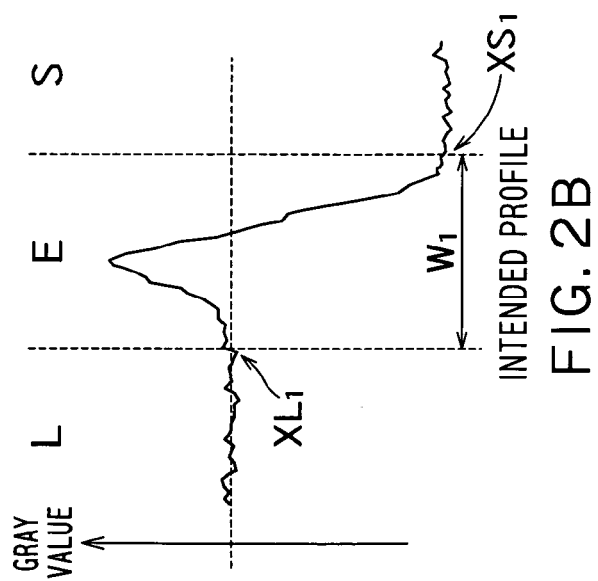
Figure 2A:
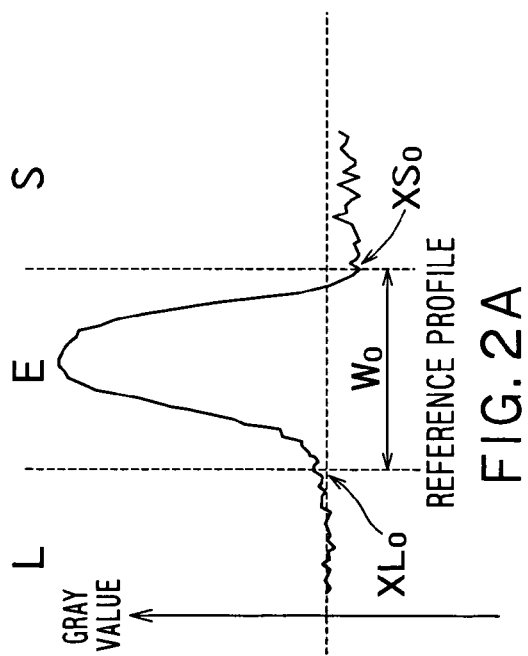
Figure 3:
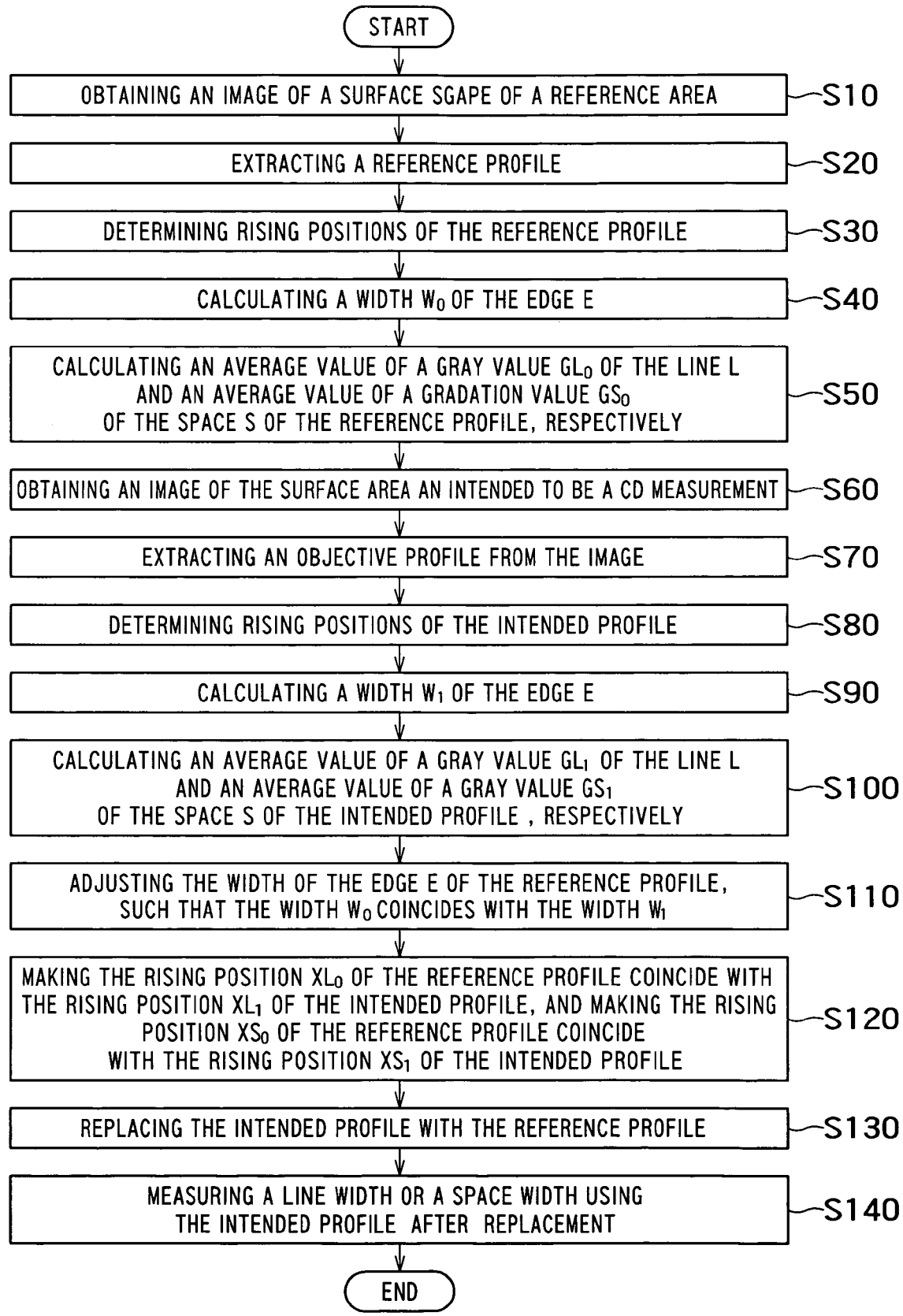
FIG. 3 is a flow diagram showing a flow of the operation of the CD-SEM 100 according to a first embodiment.
Figure 11:
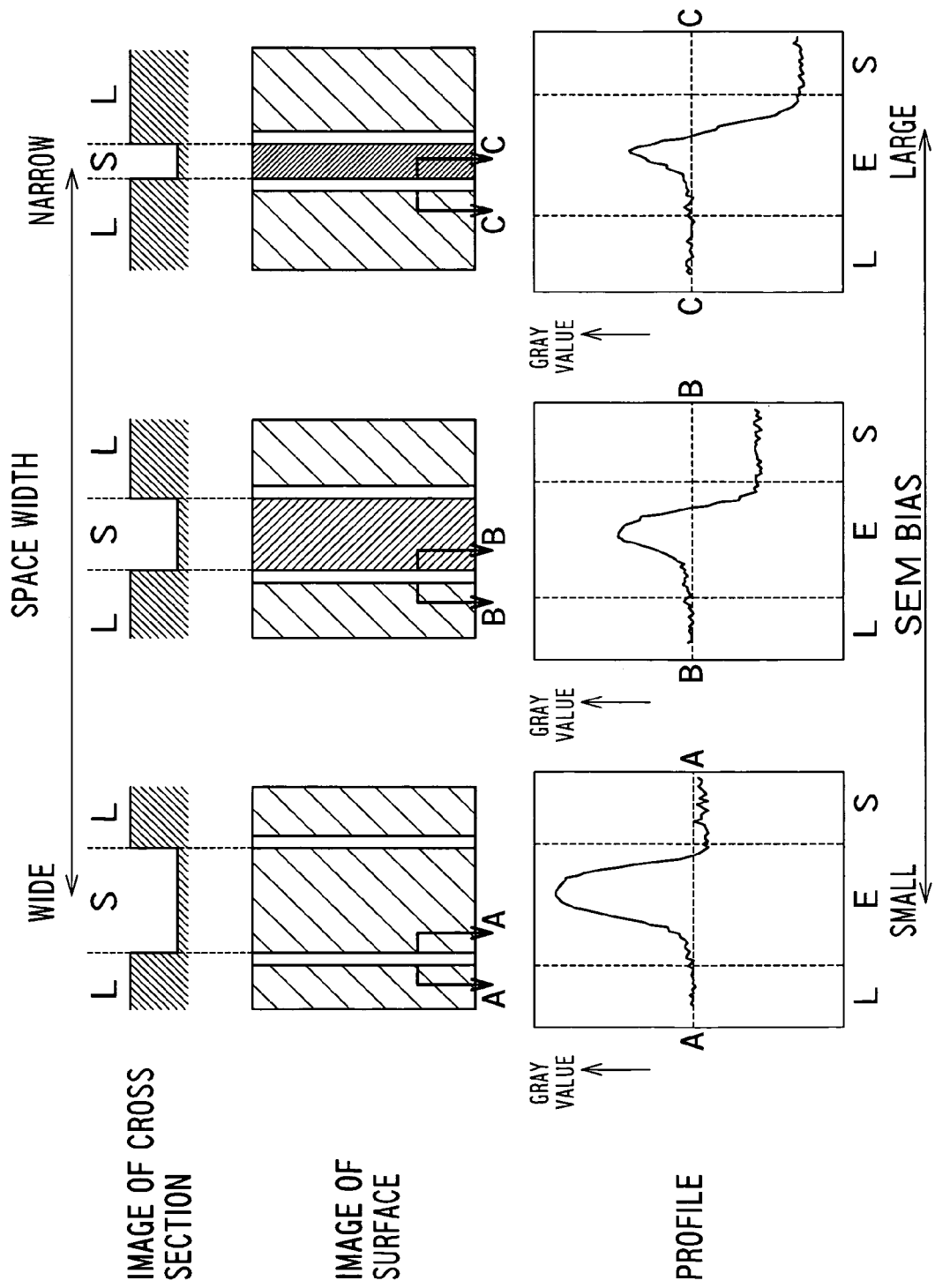
FIG. 11 is diagrams showing a state that a conventional CD measurement.

The operation of the CD-SEM 100 is explained with reference to FIG. 2(A) to FIG. 2(C) and FIG. 3. FIG. 2(A) to FIG. 2(C) are diagrams showing a state that an intended profile is replaced with a reference profile. FIG. 3 is a flow diagram showing a flow of the operation of the CD-SEM 100 according to a first embodiment. Profiles shown in FIG. 2(A) to FIG. 2(C) are grayscale profiles at one edge of a space S. For example, FIG. 2(A) corresponds to the profile along the line A—A of the surface image shown in FIG. 11, and FIG. 2(B) corresponds to the profile along the line C—C of the surface image shown in FIG. 11. The gray values of these profiles follow the quantity of the secondary electrons detected by the detector 6.

These profiles are expressed in one-dimensional gray values based on the detection quantity of the secondary electrons.

As shown in FIG. 2(A), the CD-SEM 100 first obtains an image of a surface shape of a reference area of the sample 5 (S10), and extracts a reference profile, which becomes a reference of image processing, from this image (S20). The reference area is a surface area on the sample, in which a difference between the quantity of secondary electrons in the line L and that in the space S is relatively small. In other words, an area having a sufficiently large line L and a sufficiently large space S are selected as the reference area from the surface area of the sample 5 so that a difference of contrast between the line L and the space S of the image becomes relatively small.

The reference profile is generated by extracting a grayscale profile of the secondary electron image of the reference area. For example, the grayscale profile between the line L and the space S is extracted for each pixel of the image in a direction substantially vertical to a extending direction of the line L or the space S. These grayscale profiles are averaged in the extending direction of the line L or the space S. With this arrangement, an image of a high S/N ratio can be obtained by suppressing the influence of noise, that is, by suppressing the influence of contrasts other than the shape contrast.

There is a step at an edge E between the line L and the space S. Considering a sidewall of the step, the quantity of secondary electrons detected from the edge E becomes larger than the quantity of secondary electrons detected from the line L or the space S. Therefore, the edge E between the line L and the space S has a higher contrast (a higher gray value) than that of the line L or the space S.

Rising positions of the reference profile are determined (S30). A rising position of the edge E from the line L toward the space S is set as $XL_0$, and a rising position of the edge E from the space S toward the line L is set as $XS_0$. The rising positions $XL_0$ and $XS_0$ of the reference profile can be set at a position where the gray value of the reference profile exceeds a predetermined threshold value, for example. Alternatively, two inclinations of the reference profile at the edge E and curves of the reference profile at the line L and the space S are approximated as straight lines, respectively. An intersecting point between a straight line corresponding to the inclination of the edge E at the line L side and the straight line corresponding to the line L can be set as the rising position $XL_0$. An intersecting point between a straight line corresponding to the inclination of the edge E at the space S side and the straight line corresponding to the space S can be set as the rising position $XS_0$. Methods of determining the rising positions $XL_0$ and $XS_0$ are not limited to these methods, and various other methods can be also employed.

Next, a distance between the rising positions $XL_0$ and $XS_0$, that is, a width $W_0$ of the edge E, is calculated (S40). The width $W_0$ may be obtained by calculating ($XL_0$–$XS_0$). Next, an average value of a gray value $GL_0$ of the line L and an average value of a gray value $GS_0$ of the space S of the reference profile respectively are calculated (S50).

As shown in FIG. 2(B), the CD-SEM 100 obtains a secondary electron image of an area of CD measurement in the surface area of the sample 5 (S60). The CD-SEM 100 extracts an intended profile, which is intended to be image-processed, from this image (S70). This intended profile has a relatively large difference between the quantity of secondary electrons in the line L and that in the space S. Therefore, there is a large difference between the gray value of the line L and that of the space S, as shown in FIG. 2(B).

Rising positions of the intended profile are then determined (S80). A rising position of the edge E from the line L toward the space S is set as $XL_1$, and a rising position of the edge E from the space S toward the line L is set as $XS_1$. The rising positions $XL_1$ and $XS_1$ can be determined according to a method similar to that used to determine the rising positions $XL_0$ and $XS_0$.

Next, a distance between the rising positions $XL_1$ and $XS_1$, that is, a width $W_1$ of the edge E, is calculated (S90). The width $W_1$ may be obtained by calculating ($XL_1$–$XS_1$). Next, an average value of a gray value $GL_1$ of the line L and an average value of a gray value $GS_1$ of the space S of the intended profile respectively are calculated (S100).

The width of the edge E of the reference profile is adjusted such that the width $W_0$ of the edge of the reference profile coincides with the width $W_1$ of the edge of the intended profile (S10). In order to adjust the widths $W_0$ and $W_1$, the total width of the edge E is expanded or reduced, or only the width of the edge E from its peak position to the line L side is expanded or reduced, or only the width of the edge E from its peak position to the space S side is expanded or reduced. Methods of adjusting the widths $W_0$ and $W_1$ are not limited to the above, and various other methods can be also employed.

As shown in FIG. 2(C), the CD-SEM 100 makes the rising position $XL_0$ of the reference profile coincide with the rising position $XL_1$ of the intended profile, and makes the rising position $XS_0$ of the reference profile coincide with the rising position $XS_1$ of the intended profile (S120). In this case, the CD-SEM 100 also makes the gray value $GL_0$ coincide with the gray value $GL_1$. In the area of the line L, the detection quantity of secondary electrons in the reference profile is substantially equal to the detection quantity of secondary electrons in the intended profile. Therefore, a proper replacement can be achieved at the next step S130 by making the gray value $GL_0$ coincide with the gray value $GL_1$ in the line L.

The intended profile is replaced with the reference profile in the state that the rising positions $XL_0$ and $XS_0$ of the reference profile coincide with the rising positions $XL_1$ and $XS_1$ of the intended profile, respectively (S130). As a result, the profile at one edge of the space S in the target area is corrected. The process at steps S10 to S130 is also executed for the profile at the other edge of the space S. Last, the CD-SEM 100 measures a line width or a space width using the profile after replacement (S140). Thus, the CD-SEM 100 measures the dimensions of surface patterns on the sample 5 using the profile after the replacement.

According to the present embodiment, the image processor 9 can execute the processing at steps S10 to S140. In place of the image processor 9, the control calculator 10 can execute the processing at steps S10 to S140. The monitor 11 can display the image of the reference area, the image of the intended area, the reference profile, the intended profile, the intended profile after replacement, and the CD measurement value, or can selectively display a part of these.

The processing of the reference profile at steps S10 to S50 can be executed after the processing of the intended profile at steps S60 to S100.

An image based on the quantity of secondary electrons may be a backscattered electron image or a substrate current image, instead of a secondary electron image. The present embodiment can be also applied to an image based on an optional signal that is generated from the sample 5 based on irradiation of a charged particle beam. A representative charged particle is electron or ion, or can be photon.

Effect of the present embodiment is explained with reference to FIG. 2(C) again. The gray levels at the space S side of the reference profile and that of the intended profile are set $LS_0$ and $LS_1$, respectively, and peaks of the reference profile and that of the intended profile are set $P_0$ and $P_1$, respectively. In general, CD measurement is executed using an intermediate position $M_1$ of the level $LS_1$ and the peak $P_1$.

As explained in the background art, when the space width becomes small, the SEM bias increases at the time of measuring the space width. In other words, the space width measured by using the intermediate position $M_1$ of the surface image becomes larger than the actual space width (see FIG. 11).

However, according to the present embodiment, the CD measurement is executed using an intermediate position $M_0$ of the level $LS_0$ and the peak $P_0$. There is a difference Md in the space width between the intermediate positions $M_0$ and $M_1$. The intermediate position $M_0$ is shifted to decrease the space width by the difference Md from the intermediate position $M_1$, that is, to alleviate the SEM bias (see FIG. 10). This is because the influence of contrast other than the shape contrast is restricted as a result of substituting the intended profile to reference profile, as described above.

As explained above, according to the present embodiment, variation of the SEM bias can be corrected easily without obtaining cross-sectional images by repeatedly cutting the sample. As a result, CD measurement can be executed accurately and efficiently.

The present embodiment can be also applied to the sample 5 when the contrast varies due to a difference of materials of the sample 5. In this case, the reference area is a flat area to make the shape contrast and the electric field contrast small. With this arrangement, an image of high S/N ratio can be obtained by restricting the influence of noise, that is, by restricting the influence of contrast other than the material contrast. This can be used for the reference profile.

(Second Embodiment)

Figure 5:
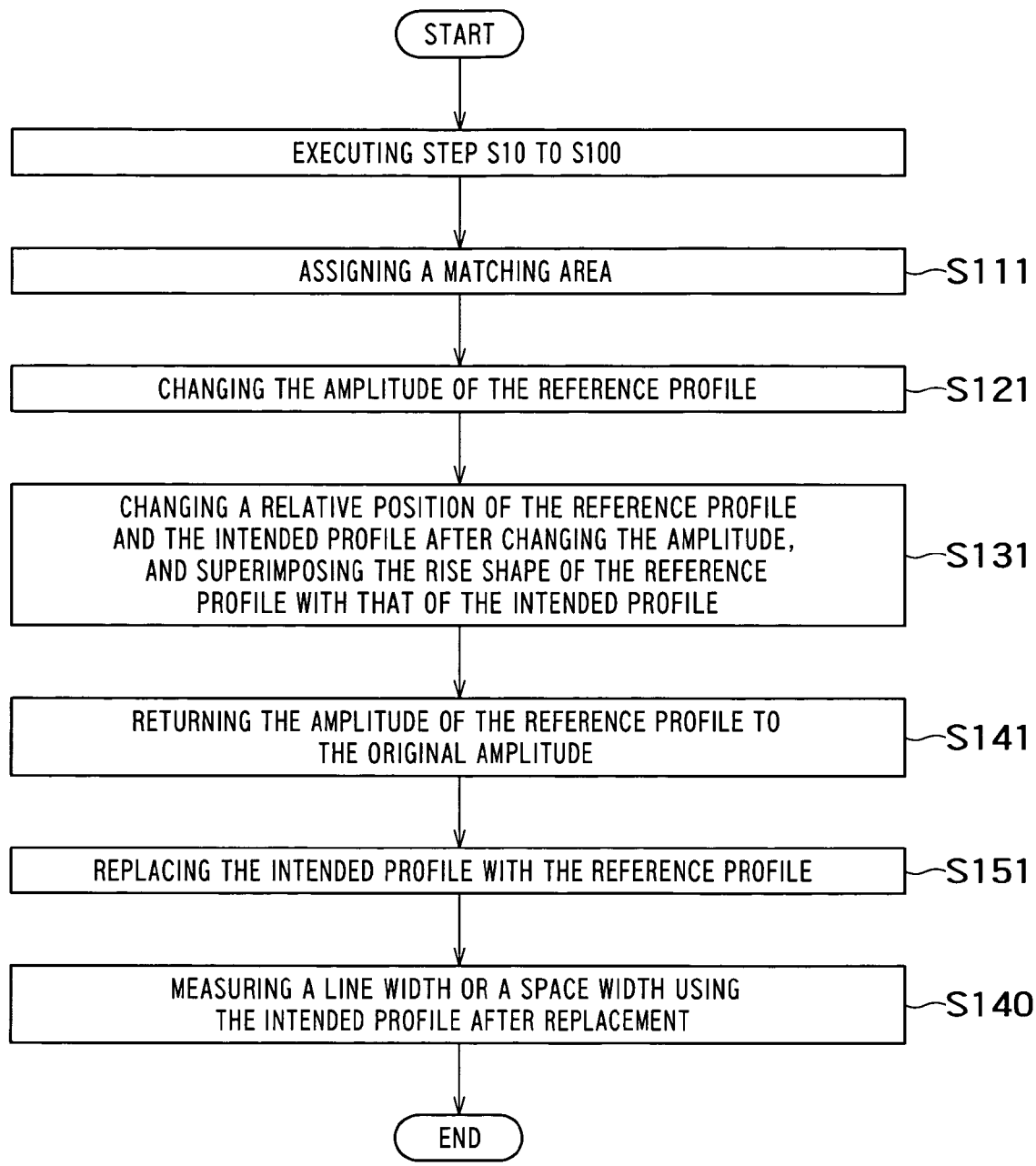
FIG. 5 is a flowchart showing a flow of the operation of the CD-SEM 100 according to the second embodiment.

FIG. 4(A) to FIG. 4(E) are diagrams showing a state that an intended profile is replaced with a reference profile according to a second embodiment of the present invention. The second embodiment can be implemented using the CD-SEM 100. FIG. 5 is a flowchart showing a flow of the operation of the CD-SEM 100 according to the second embodiment. According to the second embodiment, the process similar to that at step S10 to step S100 shown in FIG. 3 according to the first embodiment is carried out at these steps shown in FIG. 5.

As shown in FIG. 4(A), a matching area to be used to fit the position of the reference profile to the position of the intended profile is assigned (S111). According to the present embodiment, the matching area is set to a rise part from the line L toward the space S. In the area of the line L, the detection quantity of secondary electrons in the reference profile is substantially equal to that in the intended profile. Therefore, a proper replacement can be achieved at the latter step S151 by making the profiles at the line L side coincide together.

As shown in FIG. 4(B), the amplitude of the reference profile is changed (S121). In this case, the amplitude of the reference profile is changed so that the shape of the matching area of the reference profile becomes substantially the same as the shape of the rising part of the intended profile. According to the present embodiment, the amplitude of the intended profile is not changed.

As shown in FIG. 4(C), a relative position of the reference profile and the intended profile after changing the amplitude is changed, and the rise shape of the reference profile is superimposed with that of the intended profile (S131). In this case, the superimposition work is carried out so that an absolute value of a difference between the gray value of the reference profile and that of the intended profile in the matching area becomes minimum.

As shown in FIG. 4(D), the amplitude of the reference profile shown in FIG. 4(A) is returned to the original amplitude in the state that the rise shape of the reference profile and that of the intended profile are superimposed (S141).

As shown in FIG. 4(E), the intended profile is replaced with the reference profile (S151). At steps S10 to S151, the process is executed for both edges of the space S. Finally, the CD-SEM 100 measures the line width or the space width using the profile after the replacement, similarly to step S140 in FIG. 3.

A method of changing the amplitude of the reference profile at step S131 is explained. In FIG. 6, in order to change the amplitude of the reference profile, gray values of the reference profile and the intended profile are used. For example, when the space width is small, the space of the image becomes dark. Therefore, a ratio of the gray value $GS_1$ of the space S of the intended profile to the gray value $GS_0$ of the space S of the reference profile, i.e., $(GS_1/GS_0)$, is multiplied to the amplitude of the reference profile. Alternatively, the amplitude of the profile may be changed using a difference between the gray value $GS_0$ and the gray value $GS_1$.

According to the present embodiment, the image processor 9 can execute the processing at steps S10 to S151. In place of the image processor 9, the control calculator 10 can execute the process at steps S10 to S151.

In order to change the amplitude of the reference profile, a characteristic value that represents a characteristic of the surface pattern of the sample 5 can be used. The characteristic value is a grayscale ratio or a grayscale difference between the space S and the line L, a space width, a space depth, or a ratio of the space width to the space depth (i.e., aspect ratio). For example, when the aspect ratio of the space S is R, the amplitude of the reference profile can be changed by multiplying (1/R) to the amplitude of the reference profile shown in FIG. 4(A).

As explained above, according to the present embodiment, the amplitude of the reference profile and the relative position of the reference profile and the intended profile can be determined by executing the process at step S121 and step S131 once respectively. Alternatively, they can be determined by repeating the process at these steps by trial and error.

According to the present embodiment, while the amplitude of the reference profile is changed, the amplitude of the intended profile can be changed instead. In this case, in order to change the amplitude of the intended profile, $(GS_0/GS_1)$ is multiplied to the amplitude of the intended profile, or the aspect ratio R is multiplied to the amplitude of the intended profile.

The second embodiment has an effect similar to that according to the first embodiment. According to the second embodiment, the matching area is assigned to change the amplitude of the reference profile. Therefore, the detection quantity of secondary electrons that varies depending on the space width or the material of the sample can be corrected accurately. The second embodiment is particularly effective when it is difficult to determine a rise position of a subtle signal due to much noise in the image.

(Third Embodiment)

Figure 7:
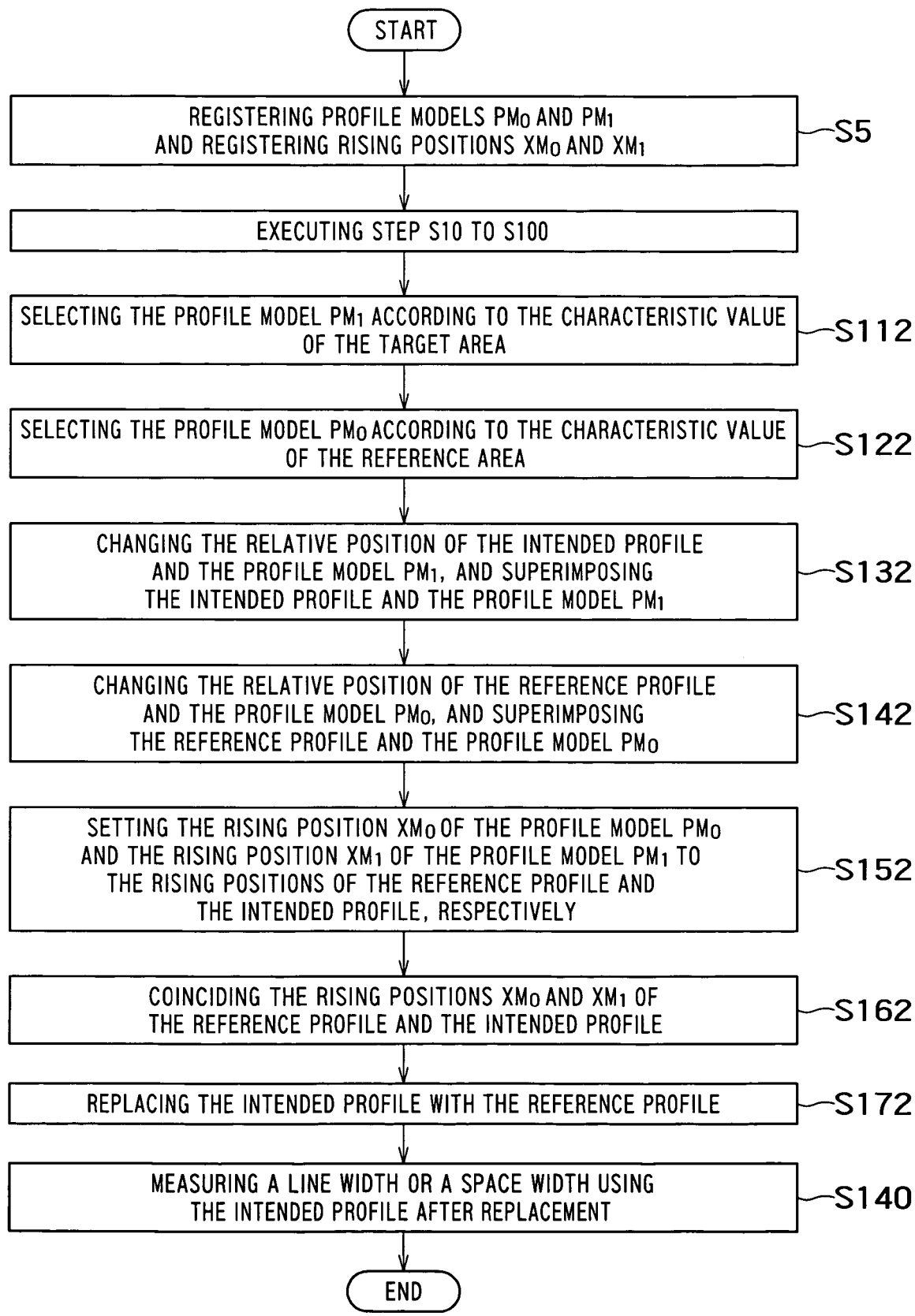
FIG. 7 is a flowchart showing a flow of the operation of the CD-SEM 100 according to the third embodiment.

FIG. 6(A) to FIG. 6(E) are diagrams showing a state that an intended profile is replaced with a reference profile according to a third embodiment of the present invention. The third embodiment can be implemented using the CD- SEM 100. FIG. 7 is a flowchart showing a flow of the operation of the CD-SEM 100 according to the third embodiment.

As shown in FIG. 6(A), profile models $PM_0$ and $PM_1$ are registered first (S5). Rising positions $XM_0$ and $XM_1$ of the edge E are set to the profile models $PM_0$ and $PM_1$, respectively, and these are registered. The profile models $PM_0$ and $PM_1$ and the rising positions $XM_0$ and $XM_1$ can be stored in the memory 91 (see FIG. 1), or can be stored in the control calculator 10.

The profile models $PM_0$ and $PM_1$ are applied to the reference profile and the intended profile, respectively. It is preferable that plural profile models having different shapes are registered in advance for the profile models $PM_0$ and $PM_1$, respectively. According to the present embodiment, attention is focused on the rising position of the edge E directed from the space S toward the line L.

According to the third embodiment, the process similar to that at step S10 to step S100 shown in FIG. 3 is carried out at these steps shown in FIG. 7.

As shown in FIG. 6(B), the profile model $PM_1$ is selected according to the characteristic value of the target area of the sample 5 (S112). Similarly, the profile model $PM_0$ is selected according to the characteristic value of the reference area of the sample 5 (S122).

As shown in FIG. 6(C), the relative position of the intended profile and the profile model $PM_1$ is changed, and the intended profile and the profile model $PM_1$ are superimposed (S132). Similarly, the relative position of the reference profile and the profile model $PM_0$ is changed, and the reference profile and the profile model $PM_0$ are superimposed (S142).

The rising positions $XM_0$ and $XM_1$ corresponding to the profile models $PM_0$ and $PM_1$ are set to the rising positions of the reference profile and the intended profile, respectively (S152).

As shown in FIG. 6(D), the rising positions $XM_0$ and $XM_1$ of the reference profile and the intended profile are coincided (S162). In this case, the levels of the gray value $GL_0$ and the gray value $GL_1$ at the line L side are also coincided. In the area of the line L, the detection quantity of secondary electrons in the reference profile is substantially equal to the detection quantity of secondary electrons in the intended profile. Therefore, a proper replacement can be achieved at the next step S172 by making the gray value $GL_0$ coincide with the gray value $GL_1$ in the line L.

As shown in FIG. 6(E), the intended profile is replaced with the reference profile in (S172). The process at steps S5 to S172 is executed for the profile at both edges of the space S. Last, the CD-SEM 100 measures a line width or a space width using the profile after replacement in a similar manner at step S140 shown in FIG. 3.

According to the present embodiment, the image processor 9 can execute the processing at steps S10 to S172. In place of the image processor 9, the control calculator 10 can execute the processing at steps S10 to S172.

According to the present embodiment, while attention is focused on the rising position of the edge E directed from the space S toward the line L, attention can be focused on the rising position of the edge E directed from the line L toward the space S.

The third embodiment can be combined with the second embodiment. For example, at the time of positioning the profile model to the reference profile or the intended profile, the matching area described in the second embodiment can be assigned. With this arrangement, the positioning of the reference profile or the intended profile with the profile model becomes easy.

The profile model can be experimentally prepared from various surface patterns. Alternatively, the profile model can be prepared by calculating the distribution of the electric field near the sample that depends on the surface pattern by using simulation.

The present embodiment has an effect similar to that according to the first embodiment. According to the present embodiment, a rising position is determined automatically by adapting the profile model to the reference profile or the intended profile. Therefore, the rising position of the reference profile or the intended profile can be determined easily. Further, when the present embodiment is combined with the second embodiment, the present embodiment has the effect of the second embodiment.

(Fourth Embodiment)

Figure 9:
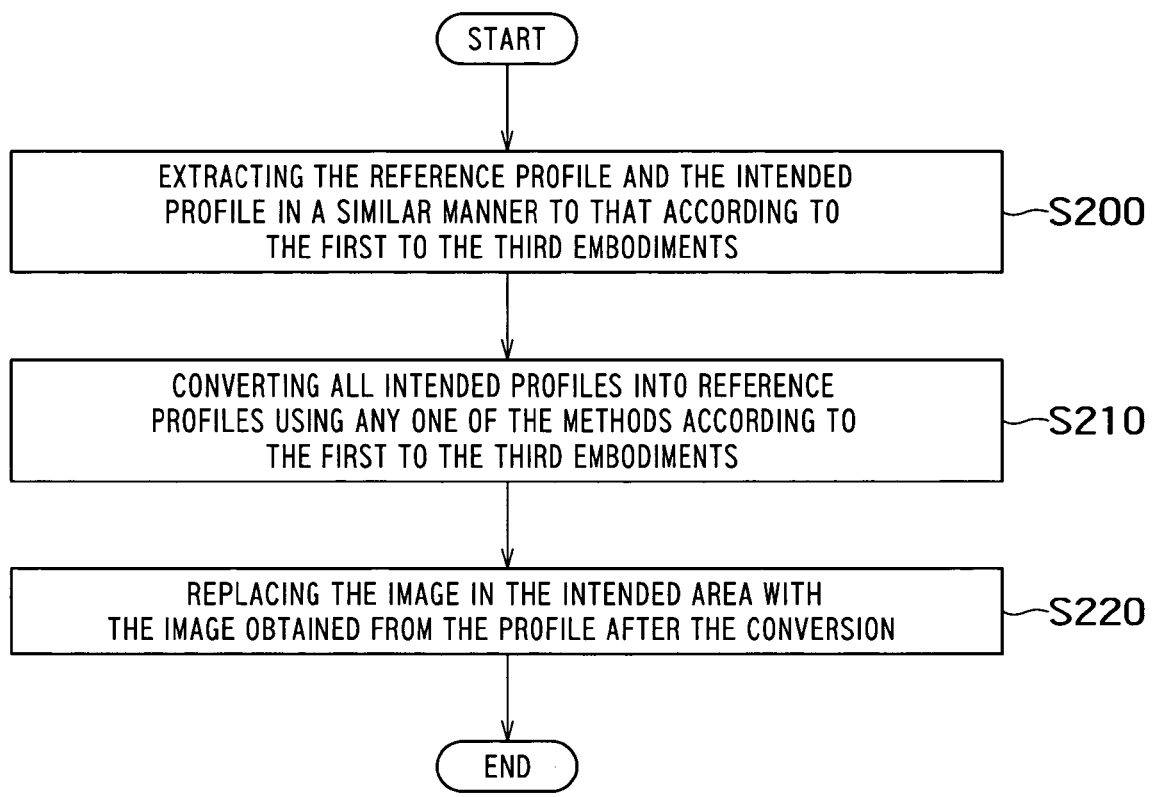
FIG. 9 is a flowchart showing a flow of the operation of the CD-SEM 100 according to the fourth embodiment.

FIG. 8(A) to FIG. 8(D) are diagrams showing a state that an intended profile is replaced with a reference profile according to a fourth embodiment of the present invention. FIG. 9 is a flowchart showing a flow of the operation of the CD-SEM 100 according to the fourth embodiment. According to the fourth embodiment, a surface image is corrected two-dimensionally using plural profiles after replacement obtained according to the first to the third embodiments. The fourth embodiment can be implemented using the CD-SEM 100.

The reference profile and the intended profile are extracted in a similar manner to that according to the first to the third embodiments (S200). A plurality of intended profiles are extracted. As shown in FIG. 8(A) and FIG. 8(B), the intended profile is extracted form each pixel of the image in the target area. When there are n pixels of the image in the target area, n intended profiles are extracted. n is an integer number.

As shown in FIG. 8(C), all intended profiles are converted into reference profiles using any one of the methods according to the first to the third embodiments (S210). There are profiles after the conversion by the same number as the number of pixels of the image in the target area. Therefore, the image in the target area can be generated using the profiles after the conversion.

As shown in FIG. 8(D), the image in the target area is replaced with the image obtained from the profile after the conversion (S220). As a result, the contrast of the image in the target area is corrected two-dimensionally.

According to the present embodiment, the image processor 9 can execute the processing at steps S200 to S210. In place of the image processor 9, the control calculator 10 can execute the processing at steps S200 to S210.

The fourth embodiment can be applied to the CD measurement. According to the fourth embodiment, the surface pattern can be also evaluated two-dimensionally. The fourth embodiment also has the effect of the first to the third embodiments.

According to the above embodiments, dimensional errors due to pattern dimensions can be decreased by decreasing unnecessary contrast of the image. Further, it is not necessary to check dependency on pattern dimensions, in measuring the SEM bias. Therefore, development efficiency of the semiconductor manufacturing process can be improved.

Figure 10:
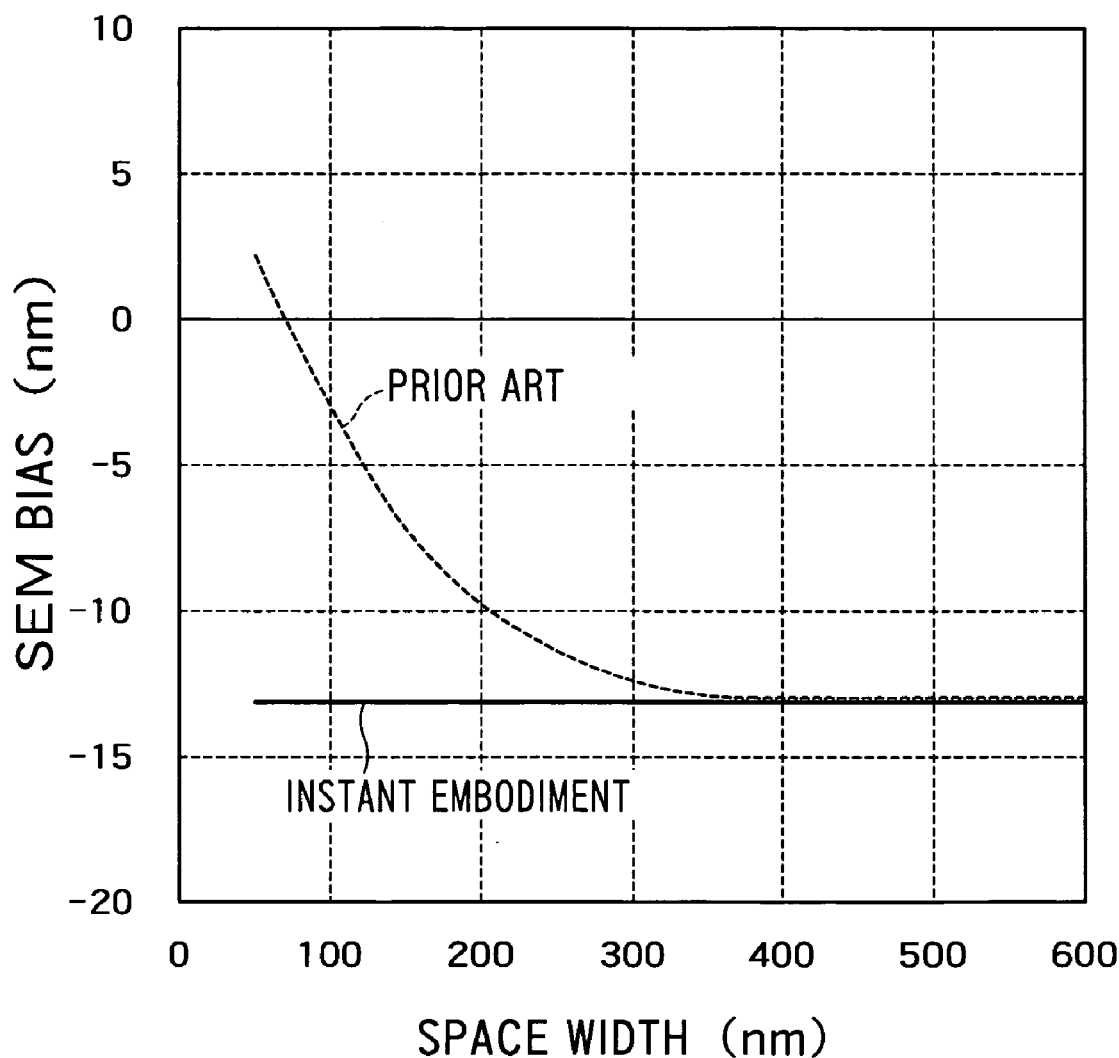
FIG. 10 is a graph showing the effect due to the first to the fourth embodiments.

FIG. 10 is a graph showing the effect due to the first to the fourth embodiments. According to these embodiments, it is possible to restrict the influence of contrast other than the shape contrast. Therefore, the SEM bias can be alleviated.

The image processing methods according to the above embodiments can be configured by hardware or can be configured by software. When the image processing methods are configured by software, a program for realizing the image processing methods is stored in a recording medium such as a flexible disk and a CD-ROM, and a computer can read and execute the program. The recording medium is not limited to a portable medium such as a magnetic disk and an optical disk, and can be a fixed recording medium such as a hard disk unit and a memory. A program for realizing the above image processing methods can be distributed via communication lines (including radio communications) such as the Internet. The program can be distributed via a cable line or a radio line such as the Internet or in storage in a recording medium, in a state that the program is enciphered, modulated, or compressed.

The invention claimed is:

1. An image processing method, which processes an image of a surface shape of a sample based on a detection quantity of secondary electrons obtained by irradiating a charged particle to the sample, comprising:
   extracting a reference profile, which indicates the detection quantity of the secondary electrons in a gray value, from an image of a reference area in the surface shape of the sample, the image of the reference area being used as a reference of an image processing;
   extracting an intended profile, which indicates the detection quantity of the secondary electrons in a gray value, from an image of an intended area in the surface shape of the sample, the image of the intended area being used as a target of image processing; and
   replacing the intended profile with the reference profile to correct the image in the intended area.

2. The image processing method according to claim 1, wherein
   a difference between quantities of the secondary electrons detected at a line and a space of the sample is smaller in the reference profile than in the intended profile.

3. The image processing method according to claim 1, further comprising, after replacing the intended profile with the reference profile:
   measuring a line width or a space width of the sample using the profile after the replacement.

4. The image processing method according to claim 1, further comprising, when replacing the intended profile with the reference profile:
   determining a rising position of the reference profile at a step portion between a line and a space in the reference area;
   determining a rising position of the intended profile at a step portion between a line and a space in the intended area;
   superimposing the reference profile with the intended profile to substantially match the rising position of the reference profile to the rising position of the intended profile;
   replacing the intended profile with the reference profile in the state that the reference profile and the intended profile are superimposed.

5. The image processing method according to claim 4, wherein
   the rising position of the reference profile is set at a position where the gray value of the reference profile crosses a predetermined threshold value, and the rising position of the intended profile is set at a position where the gray value of the intended profile crosses a predetermined threshold value.

6. The image processing method according to claim 4 further comprising, when determining the rising position of the reference profile:
   approximating an inclination of the reference profile at an edge between the line and the space in the reference area by a first straight line;
   approximating a curve of the reference profile at the line or the space in the reference area by a second straight line; and
   setting an intersecting point between the first straight line and the second straight line as the rising position of the reference profile;
   the method further comprising, during determining the rising position of the intended profile:
   approximating an inclination of the intended profile at an edge between the line and the space in the intended area by a third straight line;
   approximating a curve of the intended profile at the line or the space in the intended area by a fourth straight line; and
   setting an intersecting point between the third straight line and the fourth straight line as the rising position of the intended profile.

7. The image processing method according to claim 4 further comprising, after replacing the intended profile with the reference profile:
   measuring a line width or a space width of the sample using the profile after the replacement.

8. The image processing method according to claim 1 further comprising, when replacing the intended profile with the reference profile:
   changing an amplitude of the reference profile to substantially match a shape of a rising part of the reference profile to a shape of a rising part of the intended profile;
   changing a relative position of the reference profile and the intended profile to substantially superimpose the rising shape of the reference profile with that of the intended profile;
   returning the amplitude of the reference profile to the original amplitude in the state that the rising shape of the reference profile and that of the intended profile are superimposed;
   replacing the intended profile with the reference profile.

9. The image processing method according to claim 8 further comprising, after replacing the intended profile with the reference profile:
   measuring a line width or a space width of the sample using the profile after the replacement.

10. The image processing method according to claim 1 further comprising:
    registering a reference profile model which has a shape of a rising part of the reference profile and which is formed according to a surface shape of the reference area, and registering an intended profile model which has a shape of a rising part of the intended profile and which is formed according to a surface shape of the intended area; and
    registering a rising position of the reference profile model and a rising position of the intended profile model,
    the method further comprising, during replacing the intended profile with the reference profile:
    changing a relative position of the reference profile and the reference profile model to substantially superimpose the reference profile with the reference profile model;

changing a relative position of the intended profile and the intended profile model to substantially superimpose the intended profile with the intended profile model;

matching substantially the rising position of the reference profile model to the rising position of the intended profile model in the state that the reference profile model is superimposed with the reference profile and in the state that the intended profile model is superimposed with the intended profile; and replacing the intended profile with the reference profile in the state that the rising position of the reference profile model substantially corresponds to the rising position of the intended profile model.

11. The image processing method according to claim 10 further comprising, after replacing the intended profile with the reference profile:

measuring a line width or a space width of the sample using the profile after the replacement.

12. The image processing method according to claim 1, wherein, when extracting the intended profile, a plurality of the intended profiles are extracted from the image of the intended area, wherein, when replacing the intended profile with the reference profile, each of the intended profile is replaced with the reference profile, respectively;

the method further comprising:

generating an image of the intended area using a plurality of the profile after the replacement.

13. The image processing method according to claim 12 further comprising, after replacing the intended profile with the reference profile:

measuring a line width or a space width of the sample using the profile after the replacement.

14. An image processing apparatus, which generates an image of a surface shape of a sample based on a detection quantity of secondary electrons obtained by irradiating a charged particle to the sample and which processes the image, comprising:

a charged particle gun irradiating a charged particle to the sample;

a detector detecting secondary electrons generated from the sample by irradiating the charged particle;

a monitor displaying the image of the surface shape of the sample based on a detection quantity of secondary electrons detected by the detector;

a processor extracting a reference profile, which indicates the detection quantity of the secondary electrons in a gray value, from an image of a reference area in the surface shape of the sample, the image of the reference area being used as a reference of an image processing, the processor extracting an intended profile, which indicates the detection quantity of the secondary electrons in a gray value, from an image of an intended area in the surface shape of the sample, the image of the intended area being used as a target of image processing, and the processor replacing the intended profile with the reference profile to correct the image in the intended area.

15. The image processing apparatus according to claim 14, wherein a difference between quantities of the secondary electrons detected at a line and a space of the sample is smaller in the reference profile than in the intended profile.

16. The image processing apparatus according to claim 14, wherein the processor measures a line width or a space width of the sample using the profile after the replacement.

17. The image processing apparatus according to claim 14, wherein the processor determines a rising position of the reference profile at a step portion between a line and a space in the reference area, and determines a rising position of the intended profile at a step portion between a line and a space in the intended area, wherein the processor superimposes the reference profile with the intended profile to substantially match the rising position of the reference profile to the rising position of the intended profile, and replaces the intended profile with the reference profile in the state that the reference profile and the intended profile are superimposed.

18. A semiconductor manufacturing method using an image processing apparatus which generates an image of a surface shape of a sample based on a detection quantity of secondary electrons obtained by irradiating a charged particle to the sample and which processes the image, the image processing apparatus comprising a charged particle gun irradiating a charged particle to the sample; a detector detecting secondary electrons generated from the sample by irradiating the charged particle; a monitor displaying the image of the surface shape of the sample based on a detection quantity of secondary electrons detected by the detector; a processor extracting a reference profile, which indicates the detection quantity of the secondary electrons in a gray value, from an image of a reference area in the surface shape of the sample, the image of the reference area being used as a reference of an image processing, the processor extracting an intended profile, which indicates the detection quantity of the secondary electrons in a gray value, from an image of an intended area in the surface shape of the sample, the image of the intended area being used as a target of image processing, and the processor replacing the intended profile with the reference profile to correct the image in the intended area, the semiconductor manufacturing method comprising: measuring a dimensions of surface patterns on the sample using the profile after the replacement.

* * * * *